United States Patent [19]
Bloss, Jr. et al.

[11] Patent Number: 5,825,303
[45] Date of Patent: Oct. 20, 1998

[54] SEALED HOUSING AND METHOD OF SEALING FOR APPARATUS IN METER PIT ENCLOSURES

[75] Inventors: Kenneth R. Bloss, Jr.; Mark M. Lazar, both of New Berlin; Brenda K. Stewart, Milwaukee; Donald H. Strobel, Brookfield, all of Wis.

[73] Assignee: Badger Meter, Inc., Milwaukee, Wis.

[21] Appl. No.: 708,010

[22] Filed: Aug. 30, 1996

[51] Int. Cl.$^6$ ................................................ G08B 23/00
[52] U.S. Cl. ...................... 340/870.02; 324/74; 343/719; 343/872
[58] Field of Search .................... 340/870.02, 870.03, 340/870.01; 343/719, 872; 324/74

[56] References Cited

U.S. PATENT DOCUMENTS

| | | |
|---|---|---|
| 1,781,280 | 11/1930 | Haase et al. |
| 5,298,894 | 3/1994 | Cerny et al. ................. 340/870.02 |
| 5,583,492 | 12/1996 | Nakanishi et al. ............. 340/870.02 |
| 5,654,701 | 8/1997 | Liao et al. ........................ 341/22 |

FOREIGN PATENT DOCUMENTS 0 252 184  1/1988  European Pat. Off. .

*Primary Examiner*—Michael Horabik
*Assistant Examiner*—Albert K. Wong
*Attorney, Agent, or Firm*—Quarles & Brady

[57] ABSTRACT

A sealed housing for a transponder unit (10) in a utility meter pit enclosure has a tube (28), approximately 3¾ inches long and 1½ inches in diameter, in which transponder electronics carried by a circuit board and an antenna are inserted from the bottom and fitted into guide structures (42, 47) and then a body of epoxy sealant (50) is used to seal and form a recessed lower end of the tube (28) which, in use, may be immersed in water within a subsurface pit enclosure (11). The tube (28) is attached to a cap (22) and suspended through a hole (29) in the pit lid (15). A clamping member (38) is threaded onto the lower end of the tube (28) for trapping a portion of the pit lid (15) between said clamping member (38) and the cap (22). A method of assembling and sealing the unit (10) is also disclosed.

15 Claims, 3 Drawing Sheets

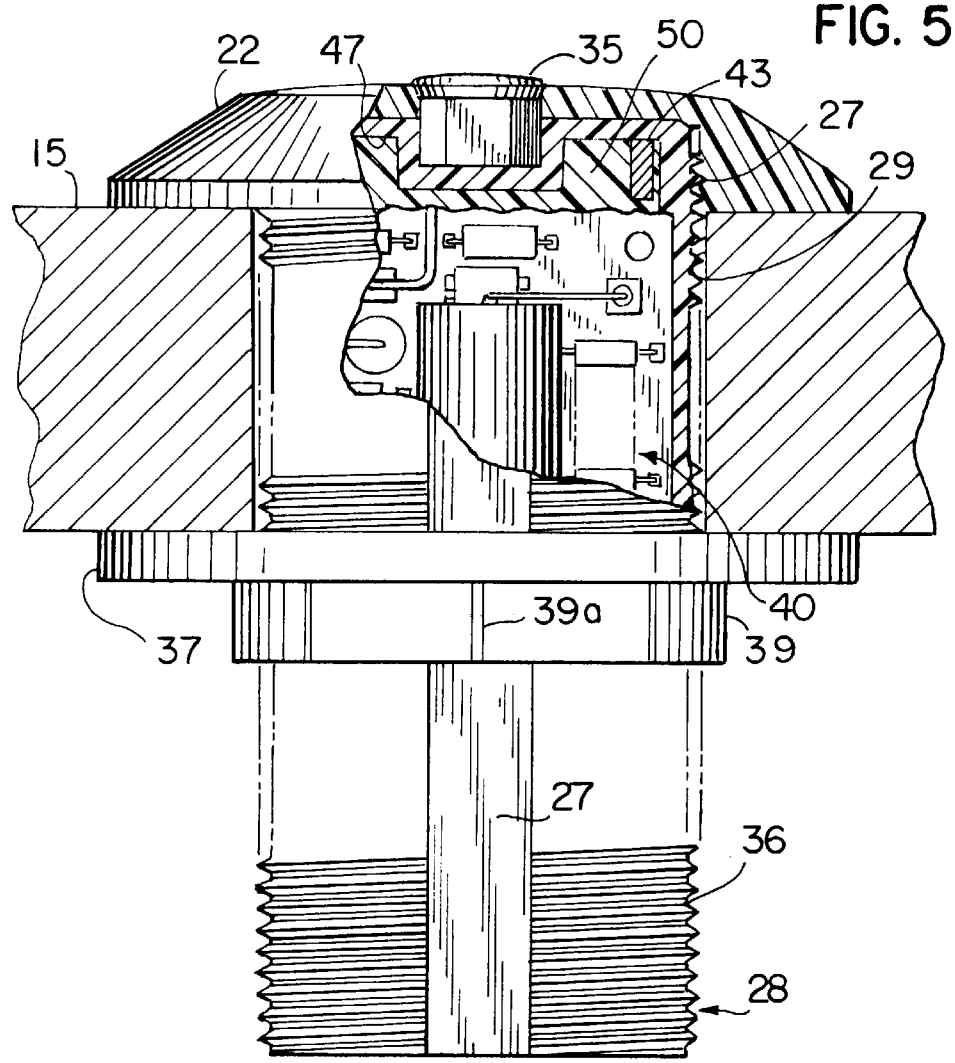
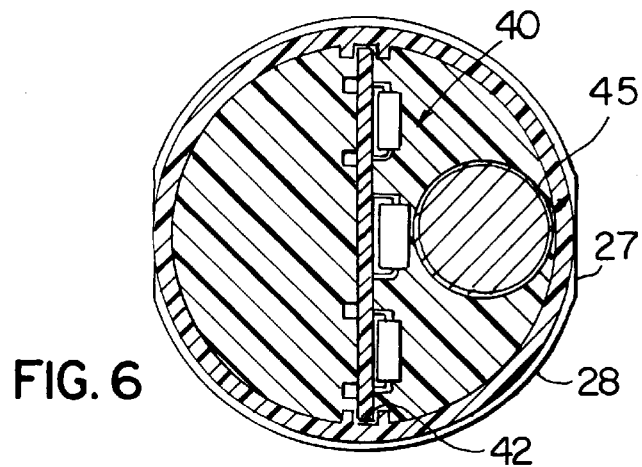

SEALED HOUSING AND METHOD OF SEALING FOR APPARATUS IN METER PIT ENCLOSURES

TECHNICAL FIELD

The invention relates to the reading of utility meters which are located in pit enclosures.

DESCRIPTION OF THE BACKGROUND ART

In moderate climate zones, utility meters are located in subsurface enclosures in areas adjacent to residences or other dwellings. Such enclosures are referred to as "pits." An example of such enclosure is illustrated in Haase et al., U.S. Pat. No. 1,781,280.

In Edwards et al., EPO Publication No. 0 252 184, meter data is collected from a utility meter in an underground pit through a wand carried by a meter reading person.

Cerny et al., U.S. Pat. No. 5,298,894, discloses a utility meter transponder which is attached to a pit lid and includes an antenna through which RF signals are transmitted to an RF interrogator unit. In one embodiment, the antenna enclosure is separate from an enclosure for the transponder electronics. In another embodiment, a cylindrical enclosure about the size of a 16-ounce container is supported from the pit lid and houses both the transponder and the antenna.

Improvements have been made in reducing the size of the electronic circuitry for converting signals from a meter register to RF signals.

The general objective of the present invention is to make corresponding improvements in the enclosure and methods of sealing the electronic circuitry in the enclosure, to provide a unit that is sealed against the environment and that is easy and low in cost to manufacture.

SUMMARY OF THE INVENTION

The invention relates to a method and housing a transponder and an antenna in a unit for use in a utility meter pit enclosure.

The housing takes the form of a tube, approximately 3¾ inches long and 1½ inches in diameter. The transponder electronics are carried by a circuit board and are inserted, along with an antenna, into the bottom end of the tube. The circuit board and antenna fit into guide structures inside the tube. A body of epoxy sealant is used to seal the tube and form a recessed lower end of the tube which, in use, may be immersed in water within a subsurface pit enclosure. The tube is attached to a cap and suspended through a hole in the pit lid. A clamping member is attached to the lower end of the stem for trapping a portion of the pit lid between said clamping member and the cap.

The invention provides a fully remote meter reading system with water-resistant features that permit installation of units in outdoor underground enclosures.

The invention provides a remote transponder unit that is smaller in size, and a housing with fewer parts than the prior art. In particular, the method of sealing eliminates the need for parts that would otherwise be used to enclose the bottom the housing.

The invention also provides a remote transponder unit that can be sealed at the factory with wires extending and connected to associated equipment, thereby avoiding field splicing of wires.

The tube is adjustable in handling pit lids of variable thickness up to three inches.

The sealant that is used provides chemical resistance and moisture resistance which is superior to that provided by silicones and polyurethanes. The sealant is sufficiently elastic, so that when used to encapsulate the electronics, it responds without adverse effects to varying temperature conditions.

Other objects and advantages, besides those discussed above, will be apparent to those of ordinary skill in the art from the description of the preferred embodiment which follows. In the description, reference is made to the accompanying drawings, which form a part hereof, and which illustrate examples of the invention. Such examples, however, are not exhaustive of the various embodiments of the invention and, therefore, reference is made to the claims which follow the description for determining the scope of the invention.

BRIEF DESCRIPTION OF THE DRAWINGS

FIG. 5 is an elevational view of the sealed transponder assembly of FIG. 1 with parts broken away; and FIG. 6 is sectional view taken in the plane indicated by line 6—6 in FIG. 3.

DETAILED DESCRIPTION OF THE PREFERRED EMBODIMENT

Figure 1:
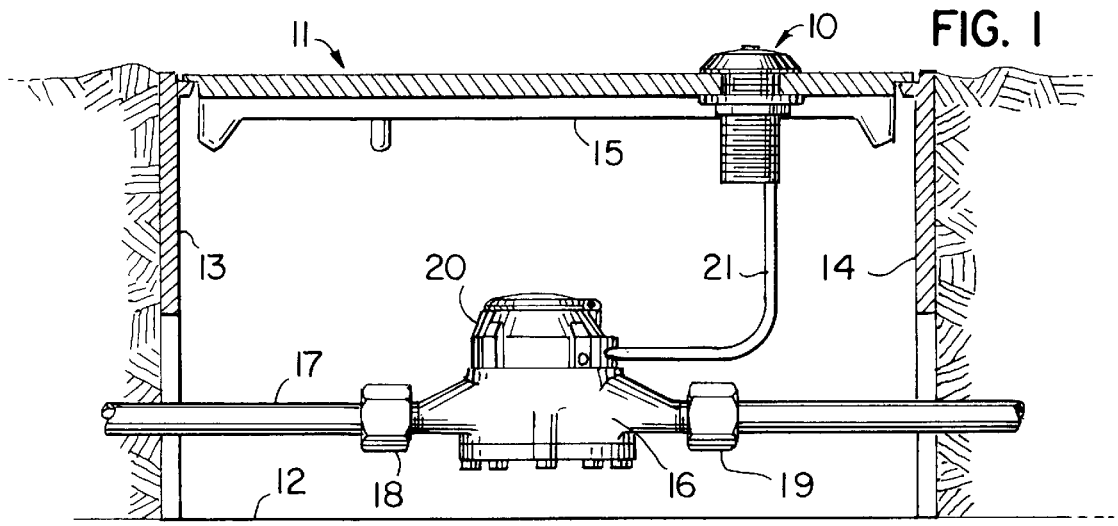
FIG. 1 is a side view in elevation showing the present invention and its environment.
Figure 2:
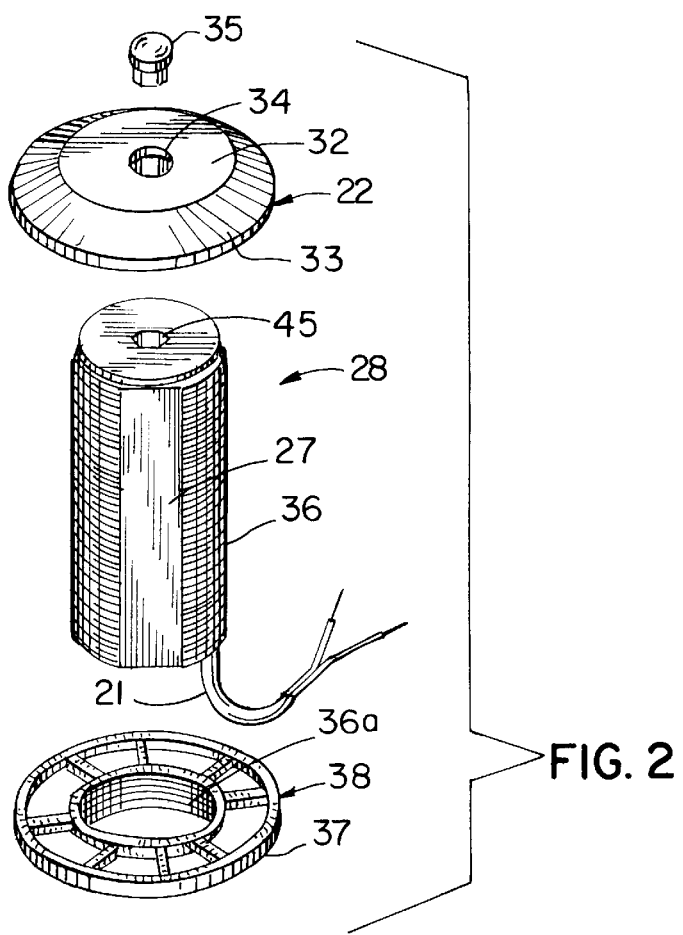
FIG. 2 is a exploded perspective view of the top portion of the assembly of FIG. 1.

Referring to FIGS. 1 and 2, the invention is incorporated in a pit transponder assembly 10 to be used in a subsurface pit enclosure 11. The pit is typically made of metal and includes sidewalls 13, 14 and a lid 15 which is removable to open the enclosure 11 for access. A bottom wall 12 is optional. The pit enclosure 11 is located along the route of water supply pipe 17. A water meter housing 16 is connected in the water supply line 17, using hex-head nuts 18, 19 which are sealed in a conventional manner against leaks at the connecting points. A water meter register unit 20 is mounted on top of the water meter housing 16. The register unit 20 is preferably a unit that is commercially distributed by Badger Meter, Inc., the assignee of the present invention, under the trade designation "Recordall" Transmitter Register (RTR). This unit 20 uses a pulse transmitter that is described in Strobel et al., U.S. Pat. No. 4,868,566, entitled "Flexible Piezoelectric Switch Activated Metering Pulse Generators."

The register unit 20 connects via a twisted pair, shielded cable 21 to a transponder assembly 10, which is enclosed in a housing 28 that hangs down from the pit lid 15.

The transponder assembly 10 communicates via low power RF signals with a collection unit carried by a meter reading person and brought into close proximity with the transponder assembly 10. The transponder assembly 10 transmits an electronic message that includes an identification code, meter reading data, and an error code for checking the data at the receiving end. The collection unit accumulates the readings from various customer locations for billing purposes.

Referring to FIG. 2, the housing 28 for the transponder electronics is formed by a threaded tube 28 with a lower end and an upper end. The tube 28 has threads 36 around its circumference except in the area of two flats 27 which are provided for handling of the tube 28.

When the transponder assembly 10 is installed, the threaded tube 28 extends through a hole 29 in the pit lid 15 as shown in FIG. 5. A low-profile cap 22 has a circular opening 27 with an inside circumferential thread that engages the thread 36 on the tube 28 as seen in FIG. 1. The cap 22 is screwed onto the threaded stem 28 and has a flat bottom side which engages a top side of the pit lid 15 to suspend the transponder assembly 10 from the pit lid 15. The top side of the cap 22 has a central portion 32 with a slightly curved profile as seen in FIGS. 1 and 2, as well as a bevel portion 33 that runs around the central portion and extends outward to the outer rim. The cap 22 also has a hexagonal opening 34 through the center to receive a hex-sided anti-tamper plug 35. Tube 28 includes hex socket 45 to receive plug 35.

As seen in FIGS. 1 and 2, the assembly also includes a collar 38 which can be screwed onto the lower end of the tube 28 to trap a portion of the pit lid 15 between it and the underside of the cap 22. The collar 38 includes threads 36*a* around an inner diameter that engage threads 36 on the outside of tube 28. The collar 38 also includes a flange 37 and a body 39 with spaced apart axially extending grooves 39*a* (FIG. 5) for gripping the collar 38. With the cap 22 and the collar 38 attached to the tube 28, there is a three inch variable length or height adjustment for the portion of the tube 28 that extends through the pit lid 28.

Figure 3:
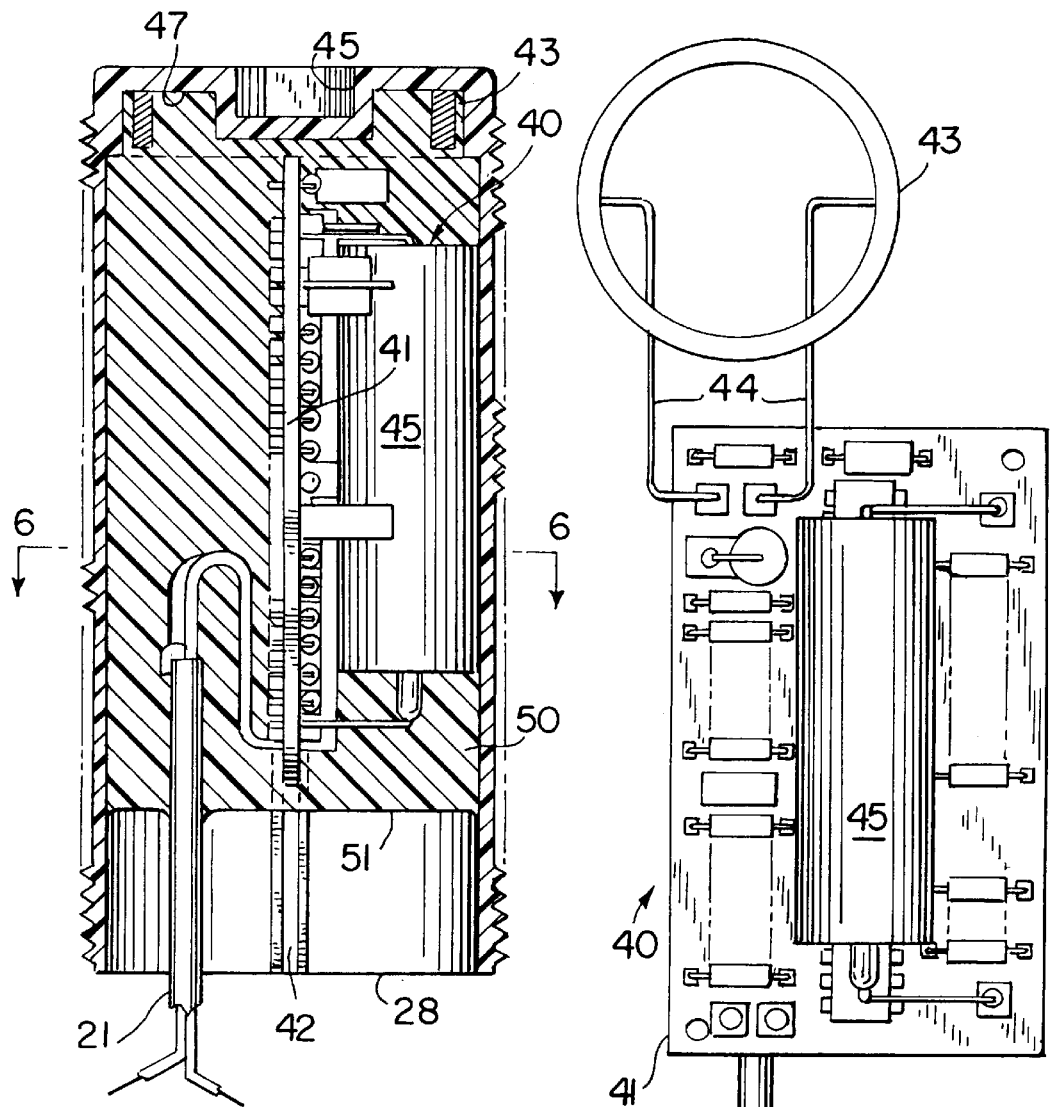
FIG. 3 is a longitudinal sectional view of the sealed transponder housing seen in FIGS. 1 and 2.
Figure 4:
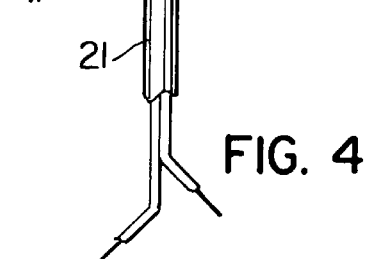
FIG. 4 is a plan view of the electronic components included in the assembly of FIG. 3.

The transponder electronics 40 (FIG. 4) are mounted on a circuit board 41 (FIG. 4) that slides into opposing guide channels 42 (FIGS. 3, 6) extending axially along the inside of the tube 28 and angularly spaced 180° apart. Also included in the transponder electronics are a battery 45 and a wire coil 43 that is connected by leads 44 to the electronics 40. The wire coil 43 functions as an RF antenna. This coil 43 is received in an annular guide recess 47 formed in an upper inside portion of the tube 28. The transponder electronics 40 is a subassembly purchased from Master Meter Company. This element 40 includes the electronic components necessary to carry out the conversion of signals from the automatic meter reading device 20 to the radio frequency signals which are transmitted to the antenna 43 and there converted to radio waves.

Wire cable 21 extends from the electronics 40 out the bottom end of the tube 28. An epoxy adhesive/sealant 50 is used to fill the cavity of the tube and encapsulate the electronics 40 and antenna 43 within the tube. The epoxy adhesive/sealant 50 is cured in place to seal the bottom end of the tube 28 and form a recessed bottom wall 51.

The sealant 50 is an epoxy available from Fel-Pro Research under Nr. 10368/335. This material provides an extremely low mixed viscosity of 200 cps, enabling the material to flow in and around all components on the transponder circuit board, completely wetting the surfaces and providing an environmental seal. The epoxy sealant exhibits superior resistance to moisture permeation as compared to sealants based on silicone or polyurethane. The epoxy provides a material that will conform to the complex surface of the circuit board and components mounted thereon. The material has a cure time of approximately four hours and this allows the opportunity to work the material and enhances wetting and the adhesion to the electronic components. The material cures to a hardness of 60–65 Shore A. This provides protection and limits access to the electronics and well as suitable elasticity in response to varying temperature conditions. The material is also resistant to deterioration resulting from contact with other materials such as hydrocarbons, ethylene glycol or other chemically reactive substances.

The resulting antenna/transponder assembly 10 is completely sealed. The transponder 40 is completely enclosed and sealed in the transponder housing 41. The antenna 43 is completely enclosed and sealed in an upper end of the tube 28. Any space in recess 47 that is not occupied by coil 43 is filled with sealant 50.

The transponder assembly 10 is connected through wire cable 21 to a meter register unit 20, so that the system is completely wired and assembled at the factory, rather than requiring the splicing of wires in the field.

In assembling the antenna/transponder assembly 10 to the pit lid, the collar 38 is first threaded onto the tube, leaving a length of approximately 0.3" greater than the thickness of the pit lid 15. The tube 28 is inserted from the underside of the pit lid 15 through the hole 29 into the recess 27 in the cap 22 and the cap 22 is threaded down to clamp on the lid 15. The collar 38 and cap 22 are adjusted until the hex opening 34 in the cap 22 is aligned with the hex recess 45 in the upper end of the tube 28. Then, the tamper-resistant plug 35 is inserted.

This has been a description of two examples of how the invention can be carried out. Those of ordinary skill in the art will recognize that various details may be modified in arriving at other detailed embodiments, and these embodiments will come within the scope of the invention.

Therefore, to apprise the public of the scope of the invention and the embodiments covered by the invention, the following claims are made.

We claim:

1. A sealed housing for use in a pit enclosure to contain an antenna and associated electronics carried by a substrate, the pit enclosure having a pit lid with a hole therein and the sealed housing comprising:

a tube having a closed upper end and an open lower end, the tube being extendable through the hole in the pit lid;

a cap for attachment to the upper end of the tube for suspending the tube from the pit lid;

a collar around the lower end of the stem for trapping a portion of the pit lid between said collar and the cap;

a guide structure within the tube for locating and supporting the substrate that carries the associated electronics; and a body of sealant disposed in said tube so as to completely seal the associated electronics and the lower open end of the tube, the sealant forming at least a portion of a bottom end of the sealed housing without the need for additional parts or fasteners.

2. The sealed housing of claim 1, wherein said tube has threads on an outer side, and wherein the cap and the collar are threadingly attached to said tube.

3. The sealed housing of claim 1, wherein the body of sealant is formed of an epoxy material.

4. The sealed housing of claim 1, wherein the upper end of the tube forms a hex-shaped aperture in its upper closed end, and wherein the cap has a hex-shaped aperture that can be aligned with the hex-shaped aperture in the upper end of the tube for receiving a plug therein.

5. The sealed housing of claim 1, wherein the guide structure comprises a pair of longitudinally extending channels formed on opposite inner sides of said tube for guiding said substrate into position within said tube.

6. The sealed housing of claim 5, wherein
said guide structure is a first guide structure; and
further comprising a second guide structure for the antenna including an annular recess in an inside upper end of the tube.

7. A sealed assembly for use in a pit enclosure having a pit lid with a hole therein, the sealed assembly comprising:
a tube having a closed upper end and an open lower end, the tube being extendable through the hole in the pit lid;
a cap for attachment to the upper end of the tube for suspending the tube from the pit lid;
a collar member around the lower end of the stem for trapping a portion of the pit lid between said collar member and the cap;
an antenna disposed within the tube and projecting above the pit lid for transmitting radio waves from the assembly;
transponder electronics carried by a substrate for transmitting radio frequency signals through the antenna;
a guide structure within the tube for locating and supporting the substrate that carries the associated electronics; and
a body of sealant disposed in said tube so as to completely seal the associated electronics and the lower open end of the tube, the sealant forming a bottom end of the sealed housing without the need for additional parts or fasteners.

8. The sealed assembly of claim 7, wherein said tube has threads on an outer side, and wherein the cap and the collar are threadingly attached to said tube.

9. The sealed assembly of claim 7, wherein the body of sealant is formed of an epoxy material.

10. The sealed assembly of claim 7, wherein the upper end of the tube forms a hex-shaped aperture in its upper closed end, and wherein the cap has a hex-shaped aperture that can be aligned with the hex-shaped aperture in the upper end of the tube for receiving a plug therein.

11. The sealed assembly of claim 7, wherein
the guide structure comprises a pair of longitudinally extending channels formed on opposite inner sides of said tube for guiding said substrate into position within said tube.

12. The sealed assembly of claim 11, wherein
said guide structure is a first guide structure; and
further comprising a second guide structure for the antenna including an annular recess in an inside upper end of the tube.

13. A method of assembly a transponder unit for a pit enclosure, the method comprising:
inserting a coil and associated electronics through an open bottom end of a tube having a closed upper end, said coil and associated electronics being inserted in guide structures within said tube;
injecting a body of encapsulating material into the open end of the tube to encapsulate and seal the coil and associated electronics within the tube, while allowing electrical leads to extend through the body of encapsulating material for electrical connection to a meter register unit;
allowing said body of encapsulating material to cure.

14. The method of claim 13, in which said encapsulating material is an epoxy material.

15. The method of claim 14, in which said encapsulating material is cured for approximately four hours.

* * * * *